US010892645B2

(12) United States Patent
Liu et al.

(10) Patent No.: US 10,892,645 B2
(45) Date of Patent: *Jan. 12, 2021

(54) CURRENT SENSE APPARATUS AND METHOD

(71) Applicant: X2 Power Technologies Limited, Grand Cayman (KY)

(72) Inventors: Sichao Liu, Shanghai (CN); Jinbiao Huang, Nashua, NH (US); Dongdong Yuan, Jiangsu (CN)

(73) Assignee: NuVolta Technologies (Hefei) Co., Ltd., Hefei (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/585,033

(22) Filed: Sep. 27, 2019

(65) Prior Publication Data

US 2020/0028381 A1    Jan. 23, 2020

Related U.S. Application Data

(63) Continuation of application No. 15/891,950, filed on Feb. 8, 2018, now Pat. No. 10,516,296.

(51) Int. Cl.
*H02J 50/10* (2016.01)
*H02J 7/02* (2016.01)
*G01R 31/302* (2006.01)
*H02J 50/60* (2016.01)
*G01R 31/50* (2020.01)

(52) U.S. Cl.
CPC ............ *H02J 50/10* (2016.02); *G01R 31/302* (2013.01); *G01R 31/50* (2020.01); *H02J 7/025* (2013.01); *H02J 50/60* (2016.02)

(58) Field of Classification Search
CPC .. H02J 50/10; H02J 50/60; H02J 7/025; H02J 7/02; G01R 31/50; G01R 31/302
See application file for complete search history.

(56) References Cited

U.S. PATENT DOCUMENTS 6,304,462 B1    10/2001    Balakrishnan et al.
10,516,296 B2 *    12/2019    Liu .......................... H02J 50/60

* cited by examiner

*Primary Examiner* — Robert L Deberadinis
(74) *Attorney, Agent, or Firm* — Slater Matsil, LLP

(57) ABSTRACT

A device includes a positive current sense amplifier having two inputs connected to a drain and a source of a power switch respectively through a plurality of positive current sense switches, and a negative current sense amplifier having two inputs connected to the drain and the source of the power switch respectively through a plurality of negative current sense switches.

20 Claims, 9 Drawing Sheets

CURRENT SENSE APPARATUS AND METHOD

PRIORITY CLAIM AND CROSS-REFERENCE

This application is a continuation of U.S. application Ser. No. 15/891,950, filed on Feb. 8, 2018, which application is hereby incorporated herein by reference.

TECHNICAL FIELD

The present invention relates to a current sense apparatus, and, in particular embodiments, to a current sense apparatus for a wireless power transfer system.

BACKGROUND

As technologies further advance, wireless power transfer has emerged as an efficient and convenient mechanism for powering or charging battery based mobile devices such as mobile phones, tablet PCs, digital cameras, MP3 players and/or the like. A wireless power transfer system typically comprises a primary side transmitter and a secondary side receiver. The primary side transmitter is magnetically coupled to the secondary side receiver through a magnetic coupling. The magnetic coupling may be implemented as a loosely coupled transformer having a primary side coil formed in the primary side transmitter and a secondary side coil formed in the secondary side receiver.

The primary side transmitter may comprise a power conversion unit such as a primary side of a power converter. The power conversion unit is coupled to a power source and is capable of converting electrical power to wireless power signals. The secondary side receiver is able to receive the wireless power signals through the loosely coupled transformer and convert the received wireless power signals to electrical power suitable for a load.

As power consumption has become more important, there may be a need for accurately monitoring the current flowing through the transmitter of the wireless power transfer system so as to achieve a high-efficiency, safe and reliable wireless power transfer between the transmitter and the receiver. Current sense devices such as current sense resistors have become the preferred choice for achieving high performance (e.g., accurate current measurement information) because current sense resistors can be connected in series with one power switch of the transmitter. However, as the current flowing through the power switch of the transmitter goes higher, the power loss of the current sense resistors has become a significant issue, which presents challenges to designers of wireless power transfer systems.

It would be desirable to have a current sense apparatus for use in high power wireless power transfer applications exhibiting good behaviors such as highly-accurate current sensing and low power consumption. It would be also necessary to achieve the reliable foreign object detection (FOD) in the wireless power transfer applications by using highly-accurate current sensing.

SUMMARY

These and other problems are generally solved or circumvented, and technical advantages are generally achieved, by preferred embodiments of the present disclosure which provide a current sense apparatus having highly-accurate current sensing and low power consumption.

In accordance with an embodiment, a device comprises a positive current sense amplifier having two inputs connected to a drain and a source of a power switch respectively through a plurality of positive current sense switches, and a negative current sense amplifier having two inputs connected to the drain and the source of the power switch respectively through a plurality of negative current sense switches.

In accordance with another embodiment, a system comprises a first power switch and a second power switch connected in series between a first voltage potential and a second voltage potential, an inductor connected to a common node of the first power switch and the second power switch, and a current sense apparatus connected to a drain terminal and a source terminal of one of the first power switch and the second power switch, wherein the current sense apparatus comprises a positive current sense device configured to sense a current flowing from the drain terminal to the source terminal, and a negative current sense device configured to sense a current flowing from the source terminal to the drain terminal.

In accordance with yet another embodiment, a system comprises a first power switch and a second power switch connected in series between a power source and ground, an inductor connected to a common node of the first power switch and the second power switch, and a current sense apparatus connected to a drain terminal and a source terminal of the first power switch, wherein the current sense apparatus comprises a positive current sense device configured to sense a current flowing from the drain terminal to the source terminal, and a negative current sense device configured to sense a current flowing from the source terminal to the drain terminal.

An advantage of an embodiment of the present disclosure is a current sense apparatus having highly-accurate current sensing and low power consumption.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to preferred embodiments in a specific context, namely a current sense apparatus for a wireless power transfer system. The disclosure may also be applied, however, to a variety of systems requiring accurate current sensing such as overcurrent protection, LED control, base station power supply control, motor drive control and the like. Hereinafter, various embodiments will be explained in detail with reference to the accompanying drawings.

Figure 1:
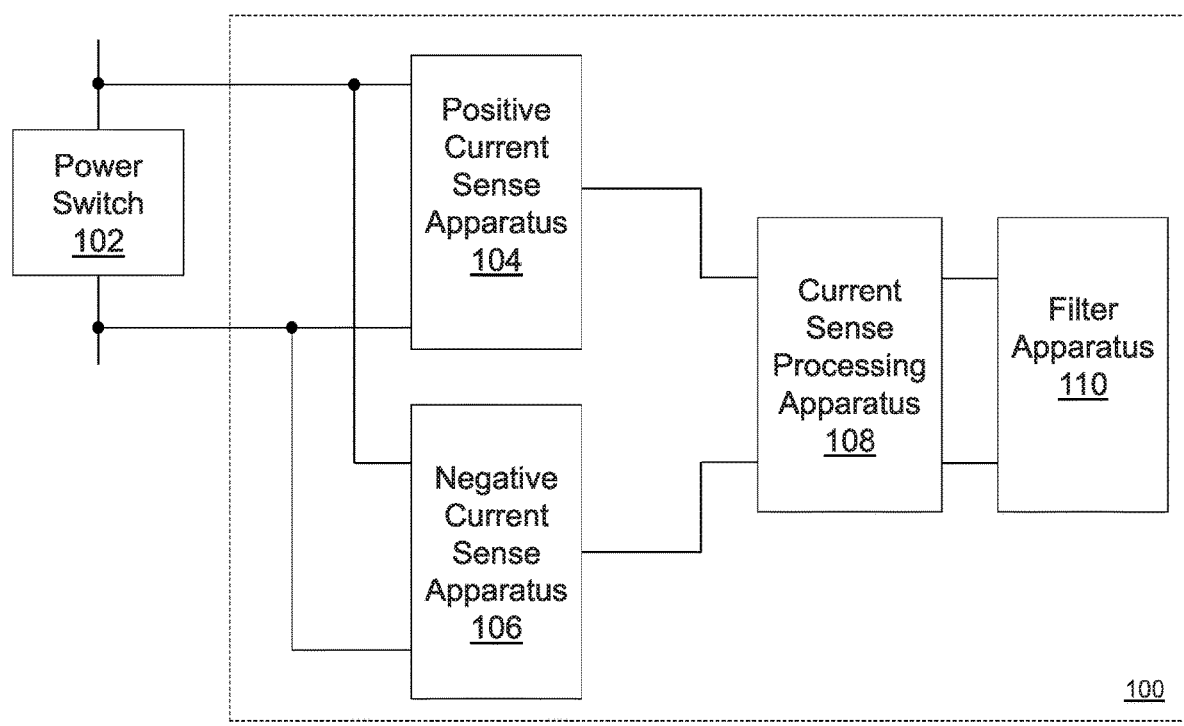
FIG. 1 illustrates a block diagram of a current sense apparatus in accordance with various embodiments of the present disclosure.

FIG. 1 illustrates a block diagram of a current sense apparatus in accordance with various embodiments of the present disclosure. The current sense apparatus 100 is connected to a power switch 102. As shown in FIG. 1, the input terminals of the current sense apparatus 100 is connected to two terminals of the power switch 102 respectively. More particularly, the power switch 102 is implemented as a power transistor such as an n-type power transistor. A first terminal of the current sense apparatus 100 is connected to a drain of the power transistor. A second terminal of the current sense apparatus 100 is connected to a source of the power transistor.

The current sense apparatus 100 comprises a positive current sense apparatus 104, a negative current sense apparatus 106, a current sense processing apparatus 108 and a filter apparatus 110. As shown in FIG. 1, the positive current sense apparatus 104 has two input terminals connected to the drain and source of the power switch 102 respectively. Likewise, the negative current sense apparatus 106 has two input terminals connected to the drain and source of the power switch 102 respectively. The outputs of the positive current sense apparatus 104 and the negative current sense apparatus 106 are fed into the current sense processing apparatus 108 as shown in FIG. 1. The outputs of the current sense processing apparatus 108 are fed into the filter apparatus 110.

In some embodiments, the positive current sense apparatus 104 is employed to sense a current passing through the power switch 102 when the load current flows from the drain to the source of the power switch 102. The positive current sense apparatus 104 is configured such that a ratio of the current passing through the power switch 102 to a sense current flowing from the positive current sense apparatus 104 to the current sense processing apparatus 108 is equal to a ratio of a drain-to-source on-resistance of a sense switch of the positive current sense apparatus 104 to a drain-to-source on-resistance of the power switch 102.

In some embodiments, the negative current sense apparatus 106 is employed to sense the current passing through the power switch 102 when the load current flows from the source to the drain of the power switch 102. The negative current sense apparatus 106 is configured such that a ratio of the current passing through the power switch 102 to a sense current flowing from the negative current sense apparatus 106 to the current sense processing apparatus 108 is equal to a ratio of a drain-to-source on-resistance of a sense switch of the negative current sense apparatus 106 to the drain-to-source on-resistance of the power switch 102.

In some embodiments, the current sense processing apparatus 108 comprises a plurality of current mirrors and bias current sources. Some current mirrors also function as current gain stages. Through the plurality of current mirrors, the current sense processing apparatus 108 converts the sensed currents from the positive current sense apparatus 104 and the negative current sense apparatus 106 into a programmable single ended output current. The current gain stages can be used to compensate fabrication process induced mismatches between the power switch 102 and the sense switches of the positive current sense apparatus 104 and the negative current sense apparatus 106.

The bias current sources may be used to compensate the temperature coefficient induced errors. More particularly, the bias current sources may provide an offset to compensate the temperature coefficient induced errors and other offset errors such as errors generated by the operational amplifiers of the current sense apparatus (e.g., operational amplifiers OA1 and OA2 shown in FIG. 2). Furthermore, the filter apparatus 110 converts the sensed current into a current sense voltage. The current sense voltage can be used to calculate the active or true power of a system wherein the power switch 102 is located. The detailed configuration and the operation principles of the current sense apparatus 100 will be described below with respect to FIGS. 2-9.

In some embodiments, the power switch 102 is part of a wireless power transfer system (not shown). The wireless power transfer system may comprise a power transmitter and a power receiver coupled between an input power source and a load. The power transmitter may comprise a transmitter circuit and a transmitter coil connected in cascade. The power receiver may comprise a receiver coil and a rectifier connected in cascade. The receiver coil is magnetically coupled to the transmitter coil after the power receiver is placed near the power transmitter. As a result, power may be transferred to the receiver coil and further delivered to the load through the rectifier.

The transmitter circuit may be implemented as a full-bridge converter according to some embodiments. In some embodiments, the power switch 102 is a high-side switch of one leg of the full-bridge converter. Alternatively, the power switch 102 may be a low-side switch of one leg of the full-bridge converter.

It should be noted that the full-bridge converter described above is merely an example. One having ordinary skill in the art will recognize that other suitable power converters such as half-bridge converters, push-pull converters, class E topology based power converters (e.g., a class E amplifier), may alternatively be used.

In some embodiments, the power switch 102 may be implemented as an n-type metal oxide semiconductor (NMOS) transistor. Alternatively, the power switch 102 may be implemented as other types of controllable devices such as p-type metal oxide semiconductor field effect transistor (MOSFET) devices, bipolar junction transistor (BJT) devices, super junction transistor (SJT) devices, insulated gate bipolar transistor (IGBT) devices, gallium nitride (GaN) based power devices and/or the like.

Figure 2:
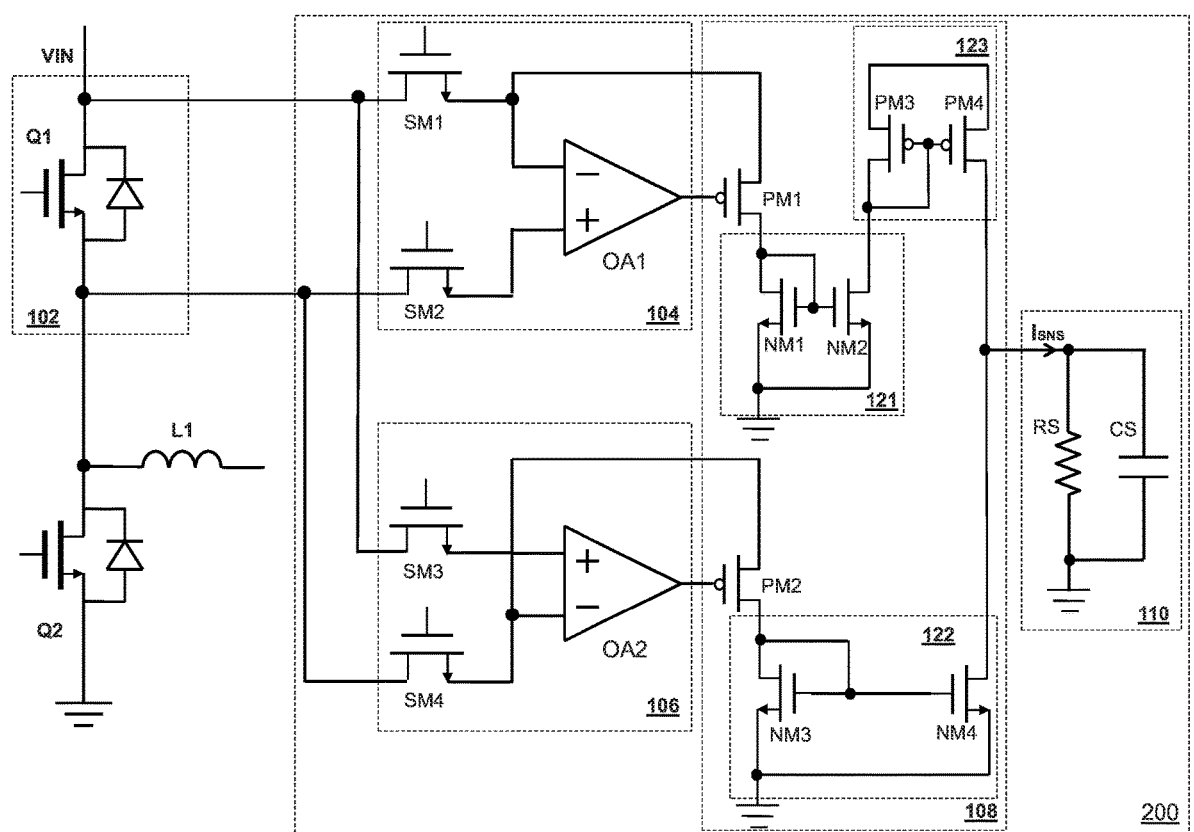
FIG. 2 illustrates a schematic diagram of a first implementation of the current sense apparatus shown in FIG. 1 in accordance with various embodiments of the present disclosure.

FIG. 2 illustrates a schematic diagram of a first implementation of the current sense apparatus shown in FIG. 1 in accordance with various embodiments of the present disclosure. As shown in FIG. 2, a first switch Q1 and a second switch Q2 are connected in series between an input power source VIN and ground. An inductive element L1 is connected to a common node of the first switch Q1 and the second switch Q2. In some embodiments, the first switch Q1 and the second switch Q2 form one leg of a full-bridge of a wireless power transfer system. The inductive element L1 is a transmitter coil. In some embodiments, both the first switch Q1 and the second switch Q2 are implemented as NMOS transistors as shown in FIG. 2.

The current sense apparatus 200 comprises the positive current sense apparatus 104, the negative current sense apparatus 106, the current sense processing apparatus 108 and the filter apparatus 110. The current sense apparatus 200 is employed to sense a current flowing through the first switch Q1.

As shown in FIG. 2, the positive current sense apparatus 104 comprises a first current sense switch SM1, a second current sense switch SM2 and a first amplifier OA1. The first current sense switch SM1 is connected between a first drain/source terminal of the first switch Q1 and an inverting input of the first amplifier OA1. The second current sense switch SM2 is connected between a second drain/source terminal of the first switch Q1 and a non-inverting input of the first amplifier OA1.

In some embodiments, the first switch Q1 and current sense switches (e.g., the first current sense switch SM1) are formed by the same type of transistor cells. For example, the first switch Q1 may comprise M transistor cells connected in parallel. The first current sense switch SM1 may comprise m1 transistor cells connected in parallel. The second current sense switch SM2 may comprise m2 transistor cells connected in parallel. In some embodiments, M is greater than m1 and m2. Furthermore, m1 is equal to m2. As a result, a ratio of a drain-to-source on-resistance of the first current sense switch SM1 to a drain-to-source on-resistance of the first switch Q1 is equal to M:m1.

The negative current sense apparatus 106 comprises a third current sense switch SM3, a fourth current sense switch SM4 and a second amplifier OA2. The third current sense switch SM3 is connected between the first drain/source terminal of the first switch Q1 and a non-inverting input of the second amplifier OA2. The fourth current sense switch SM4 is connected between the second drain/source terminal of the first switch Q1 and an inverting input of the second amplifier OA2.

In some embodiments, the third current sense switch SM3 and a fourth current sense switch SM4 have a structure similar to that of the first current sense switch SM1 and the second current sense switch SM2. For example, the first current sense switch SM1 and the second current sense switch SM2, the third current sense switch SM3 and the fourth current sense switch SM4, are formed by the same number and same type of transistor cells.

The current sense processing apparatus 108 comprises a first transistor PM1, a first current mirror 121 formed by transistors NM1 and NM2, a second transistor PM2, a second current mirror 122 formed by transistors NM3 and NM4, and a third current mirror 123 formed by transistors PM3 and PM4.

In some embodiments, the first transistor PM1 and the second transistor PM2 are implemented as p-type transistors as shown in FIG. 2. Transistors NM1, NM2, NM2 and NM4 are implemented as n-type transistors. Transistors PM3 and PM4 are implemented as p-type transistors.

As shown in FIG. 2, a gate of the first transistor PM1 is connected to an output of the first amplifier OA1. A first drain/source terminal of the first transistor PM1 is connected to the inverting input of the first amplifier OA1. A second drain/source terminal of the first transistor PM1 is connected to the first current mirror 121. The current generated by the first current mirror 121 is a sink current. This sink current is converted into a source current by the third current mirror 123.

A gate of the second transistor PM2 is connected to an output of the second amplifier OA2. A first drain/source terminal of the second transistor PM2 is connected to the inverting input of the second amplifier OA2. A second drain/source terminal of the second transistor PM2 is connected to the second current mirror. The current generated by the second current mirror 122 is a sink current.

The source current generated by the third current mirror 123 and the sink current generated by the second current mirror 122 are fed into the filter apparatus 110. The filter apparatus 110 comprises a resistor RS and a capacitor CS connected in parallel. The source current and the sink current generate an average sense current at the output of the filter apparatus 110.

One advantageous feature of having the current sense apparatus 200 is that the sense switches (e.g., transistors SM1 and SM4) help to improve the current sense accuracy and reduce unnecessary power losses. Furthermore, the current sense apparatus 200 is capable of achieving bi-directional current sensing. The detailed operating principle of the current sense apparatus 200 will be described below with respect to FIGS. 3-4.

Figure 3:
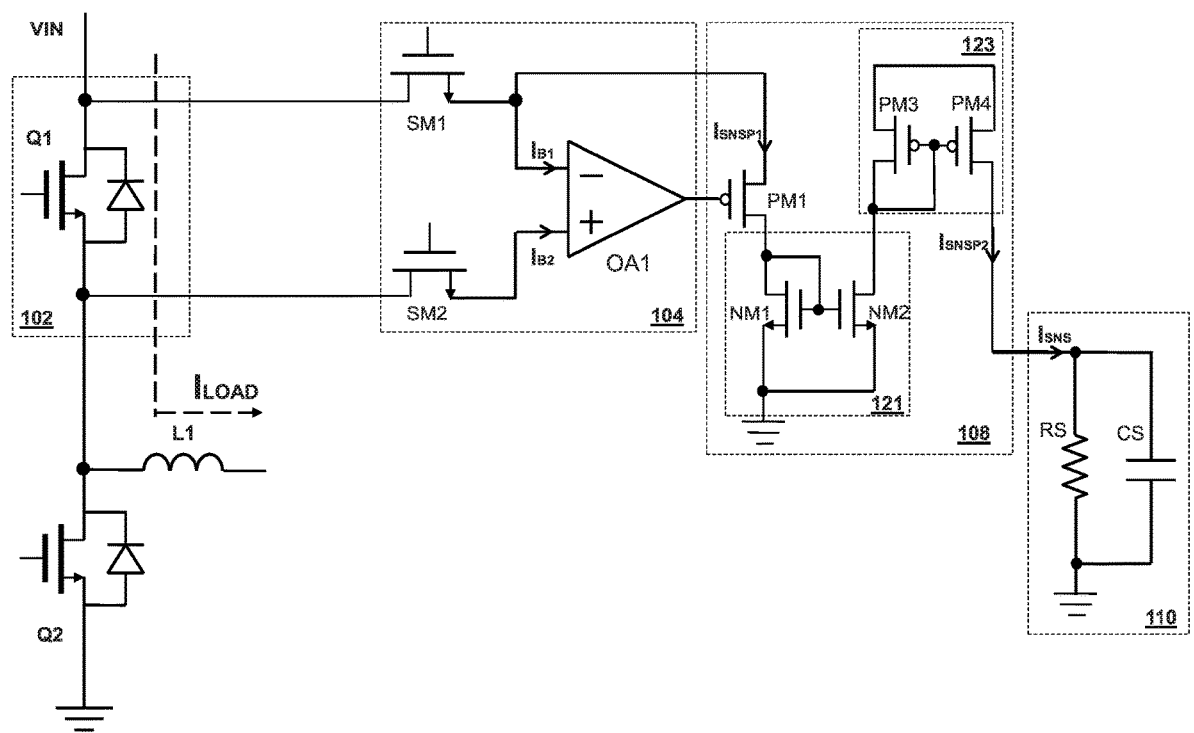
FIG. 3 illustrates the operation principle of a positive current sense and processing scheme in accordance with various embodiments of the present disclosure.

FIG. 3 illustrates the operation principle of a positive current sense and processing scheme in accordance with various embodiments of the present disclosure. As shown in FIG. 3, the dashed line indicates that the load current flows from the drain of the first switch Q1 to the source of the first switch Q1. The drain-to-source on-resistance of the first switch Q1 is defined as $R_{POWER}$. The drain-to-source on-resistance of the first sense switch SM1 is equal to the drain-to-source on-resistance of the second sense switch SM2. The drain-to-source on-resistance of the first sense switch SM1 is defined as $R_{SNS1}$. The drain-to-source on-resistance of the second sense switch SM2 is defined as $R_{SNS2}$. The current flowing through the first switch Q1 is defined as $I_{LOAD}$. The bias currents flowing into the inverting and non-inverting inputs of the first amplifier OA1 are $I_{B1}$ and $I_{B2}$ respectively as shown in FIG. 3. The current flowing into the first current mirror 121 is defined as $I_{SNSP1}$. The current flowing out of the third current mirror 123 is defined as $I_{SNSP2}$.

The positive current sense circuit shown in FIG. 3 satisfies the following equation:

$$I_{LOAD} \cdot R_{POWER} + I_{B2} \cdot R_{SNS2} = (I_{SNSP1} + I_{B1}) \cdot R_{SNS1} \quad (1)$$

The bias currents flowing into the inverting and non-inverting inputs of the first amplifier OA1 are very small and can be designed to be the same. The terms related to $I_{B1}$ and $I_{B2}$ can be canceled each other by using the same $R_{SNS1}$ and $R_{SNS2}$. As a result, Equation (1) can be simplified as:

$$I_{LOAD} \cdot R_{POWER} = I_{SNSP1} \cdot R_{SNS1} \quad (2)$$

$$I_{SNSP1} = (R_{POWER}/R_{SNS1}) \cdot I_{LOAD} \quad (3)$$

Equation (3) indicates the sensed current flowing into the first current mirror 121 is equal to the load current times a ratio of the drain-to-source on-resistance of the first switch Q1 to the drain-to-source on-resistance of the first sense switch SM1. In some embodiments, the ratio of the drain-to-source on-resistance of the first switch Q1 to the drain-to-source on-resistance of the first sense switch SM1 is about 1:10,000.

The third current mirror 123 may be used to adjust the current sense gain. In some embodiments, the current sense gain of the third current mirror 123 is equal to 1. As such, the current flowing out of the third current mirror 123 and the current flowing into the filter apparatus 110 may be given by the following equations:

$$I_{SNSP2} = I_{SNSP1} \quad (4)$$

$$I_{SNS} = I_{SNSP2} \quad (5)$$

Figure 4:
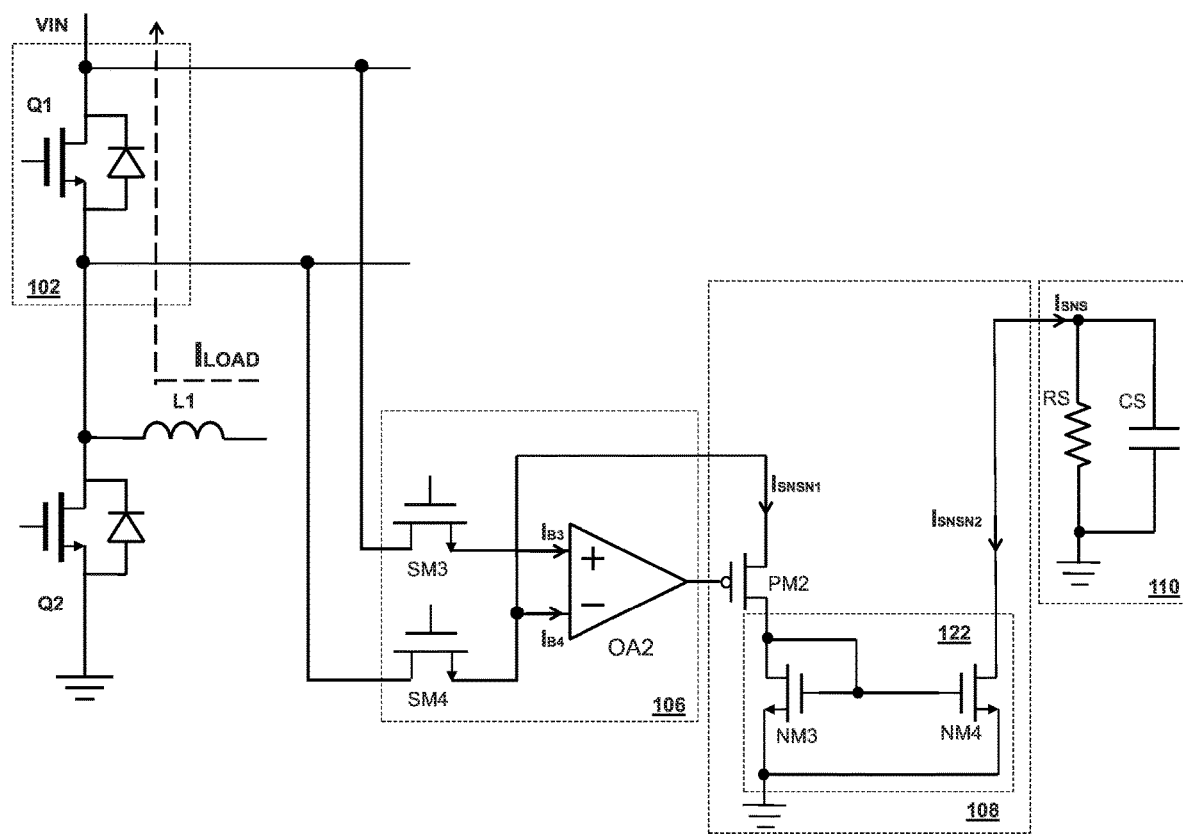
FIG. 4 illustrates the operation principle of a negative current sense and processing scheme in accordance with various embodiments of the present disclosure.

FIG. 4 illustrates the operation principle of a negative current sense and processing scheme in accordance with various embodiments of the present disclosure. As shown in FIG. 4, the load current flows from the source of the first switch Q1 to the drain of the first switch Q1. The drain-to-source on-resistance of the third sense switch SM3 is defined as $R_{SNS3}$. The drain-to-source on-resistance of the fourth sense switch SM4 is defined as $R_{SNS4}$. In some embodiments, the drain-to-source on-resistance of the third sense switch SM3 is equal to the drain-to-source on-resistance of the four sense switch SM4. The bias currents flowing into the inverting and non-inverting inputs of the second amplifier OA2 are $I_{B3}$ and $I_{B4}$ respectively as shown in FIG. 4. The current flowing into the transistor NM3 is $I_{SNSN1}$. The current flowing into the transistor NM4 is $I_{SNSN2}$.

The negative current sense circuit shown in FIG. 4 satisfies the following equation:

$$I_{LOAD} \cdot R_{POWER} + I_{B3} \cdot R_{SNS3} = (I_{SNSN1} + I_{B4}) \cdot R_{SNS4} \quad (6)$$

The bias currents flowing into the inverting and non-inverting inputs of the second amplifier OA2 are very small and can be designed to be the same. The terms related to $I_{B3}$ and $I_{B4}$ can be canceled each other by using the same $R_{SNS3}$ and $R_{SNS4}$. As a result, Equation (6) can be simplified as:

$$I_{LOAD} \cdot R_{POWER} = I_{SNSN1} \cdot R_{SNS4} \quad (7)$$

$$I_{SNSN1} = (R_{POWER}/R_{SNS4}) \cdot I_{LOAD} \quad (8)$$

Equation (8) indicates the sensed current flowing into the transistor NM3 is equal to the load current times a ratio of the drain-to-source on-resistance of the first switch Q1 to the drain-to-source on-resistance of the fourth sense switch SM4. In some embodiments, the current sense gain of the second current mirror 122 is equal to 1. As such, the current flowing into the transistor NM4 and the current flowing into the filter apparatus 110 may be given by the following equations:

$$I_{SNSN2} = I_{SNSN1} \quad (9)$$

$$I_{SNS} = -I_{SNSN2} \quad (10)$$

Figure 5:
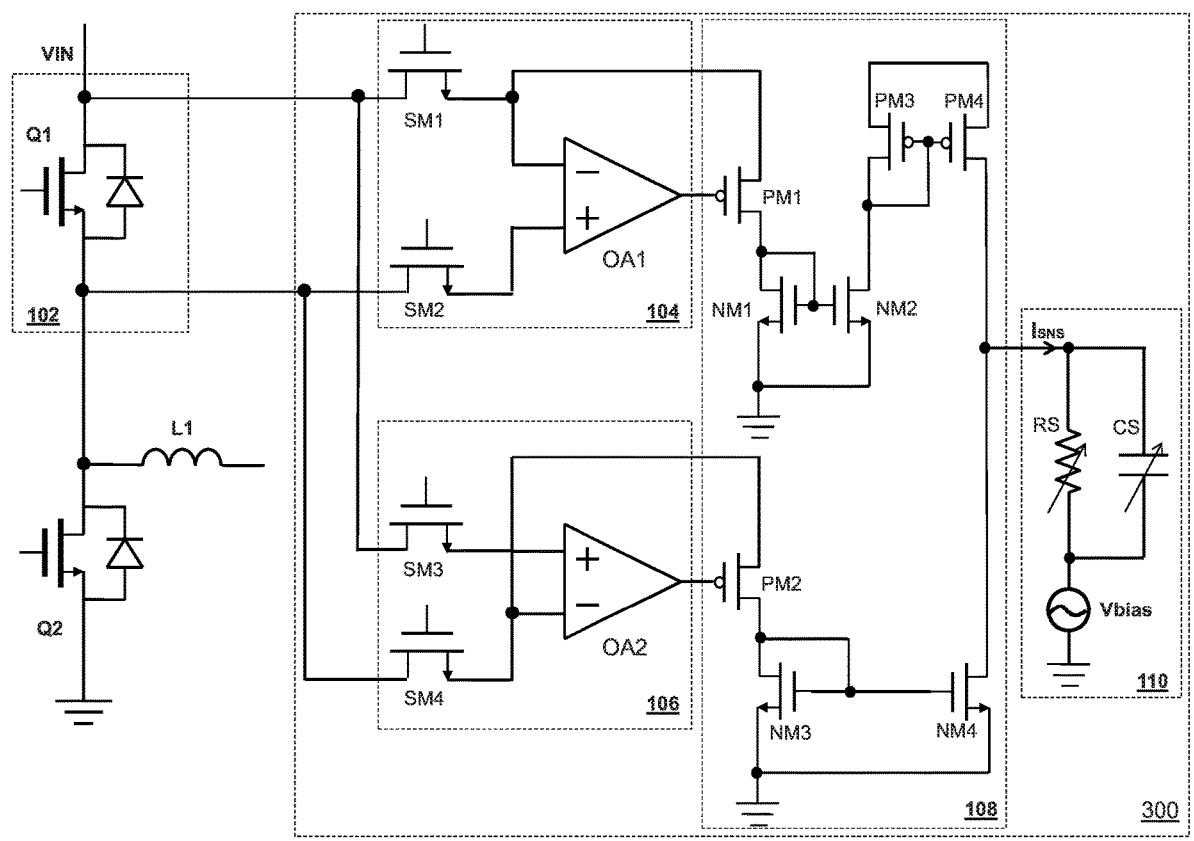
FIG. 5 illustrates a schematic diagram of a second implementation of the current sense apparatus shown in FIG. 1 in accordance with various embodiments of the present disclosure.

FIG. 5 illustrates a schematic diagram of a second implementation of the current sense apparatus shown in FIG. 1 in accordance with various embodiments of the present disclosure. The current sense apparatus 300 is similar to the current sense apparatus 200 shown in FIG. 2 except that 1) resistor RS and capacitor CS are replaced by adjustable resistor RS and adjustable capacitor CS respectively; 2) resistor RS and capacitor CS are connected to a fixed voltage Vbias. In comparison, resistor RS and capacitor CS in FIG. 2 are connected to ground. In some embodiments, the time constant of the filter apparatus 110 is adjustable by adjusting the capacitor CS. Furthermore, the resistor RS shown in FIG. 5 is configured to be adjusted to achieve a different current sense gain. The fixed voltage Vbias can be dynamically adjusted so as to achieve better current mirror performance.

Figure 6:
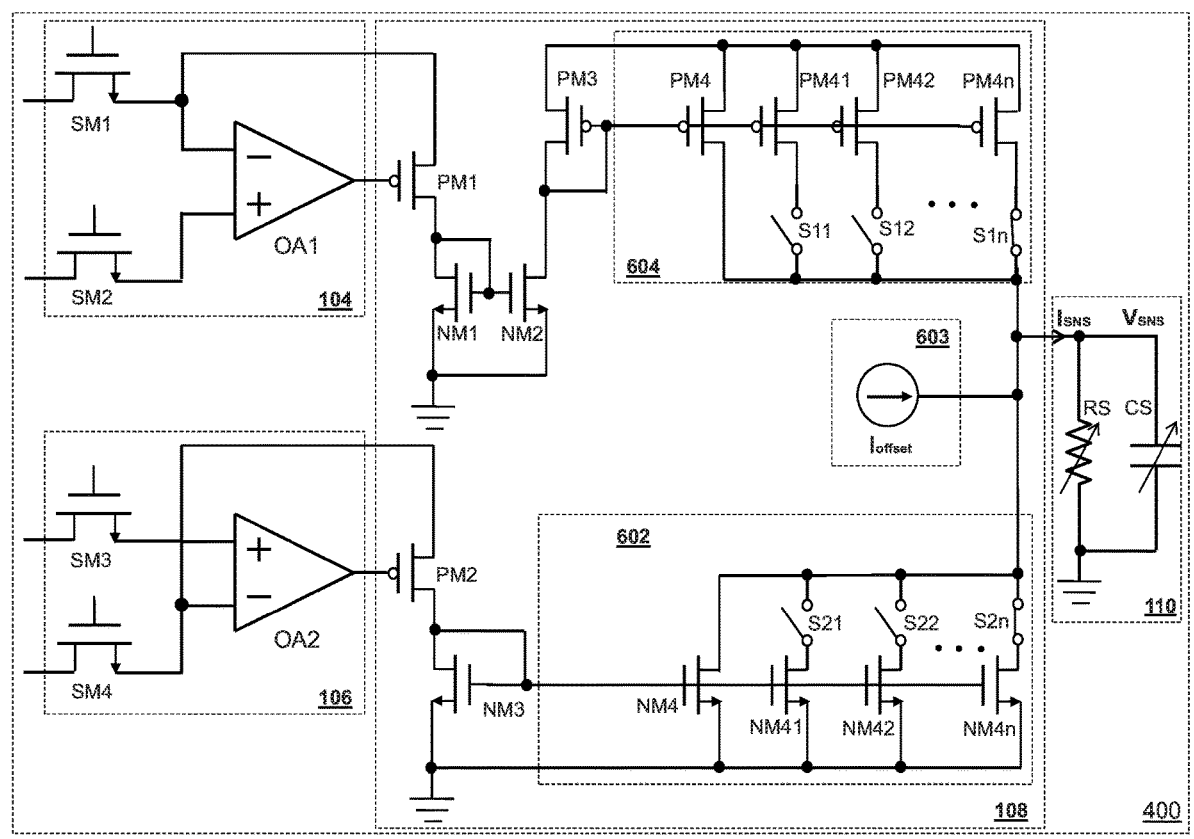
FIG. 6 illustrates a schematic diagram of a third implementation of the current sense apparatus shown in FIG. 1 in accordance with various embodiments of the present disclosure.

FIG. 6 illustrates a schematic diagram of a third implementation of the current sense apparatus shown in FIG. 1 in accordance with various embodiments of the present disclosure. The current sense apparatus 400 is similar to the current sense apparatus 200 shown in FIG. 2 except that both the second current mirror and the third current mirror include a plurality of transistor-switch networks. As shown in FIG. 6, transistors NM3 and NM4 form the second current mirror 602. A plurality of lower transistor-switch networks are connected in parallel with the transistor NM4.

As shown in FIG. 6, the plurality of transistor-switch networks comprises a first lower transistor-switch network formed by switch S21 and transistor NM41, a second lower transistor-switch network formed by switch S22 and transistor NM42, and an nth lower transistor-switch network formed by switch S2n and transistor NM4n. Each of the plurality of lower transistor-switch networks shown in FIG. 6 is placed in a mirror configuration with the transistor NM3.

By selecting the parameters (e.g., geometries) of the transistors of the plurality of lower transistor-switch networks, the current gain from each of the plurality of lower transistor-switch networks can be adjusted accordingly. For example, by selecting the geometries of the transistors, a ratio of the current flowing through the transistor NM3 to the current flowing through the transistor NM4 can be set to 10:6. A ratio of the current flowing through the transistor NM3 to the current flowing through the transistor NM41 can be set to 10:4. A ratio of the current flowing through the transistor NM3 to the current flowing through the transistor NM42 can be set to 10:2. A ratio of the current flowing through the transistor NM3 to the current flowing through the transistor NM4n can be set to 10:0.125.

In operation, by selecting the on/off the switches (e.g., S21, S22 and S2n), the current gain of the negative current sense apparatus can be adjusted accordingly.

As shown in FIG. 6, transistors PM3 and PM4 form the third current mirror 604. In order to have an adjustable current gain stage for sensing the positive current, the third current mirror 604 further comprises a plurality of upper transistor-switch networks connected in parallel with the transistor PM4.

As shown in FIG. 6, the plurality of upper transistor-switch networks comprises a first upper transistor-switch network formed by switch S11 and transistor PM41, a second upper transistor-switch network formed by switch S12 and transistor PM42, and an nth upper transistor-switch network formed by switch S1n and transistor PM4n. Each of the plurality of upper transistor-switch networks shown in FIG. 6 is placed in a mirror configuration with the transistor PM3.

By selecting the parameters (e.g., geometries) of the transistors of the plurality of upper transistor-switch networks, the current gain from each of the plurality of upper transistor-switch networks can be adjusted accordingly. For example, by selecting the geometries of the transistors, a ratio of the current flowing through the transistor PM3 to the current flowing through the transistor PM4 can be set to 10:6. A ratio of the current flowing through the transistor PM3 to the current flowing through the transistor PM41 can be set to 10:4. A ratio of the current flowing through the transistor PM3 to the current flowing through the transistor PM42 can be set to 10:2. A ratio of the current flowing through the transistor PM3 to the current flowing through the transistor PM4n can be set to 10:0.125.

In operation, by selecting the on/off of the switches (e.g., S11, S12 and S1n), the current gain of the positive current sense apparatus can be adjusted accordingly.

A bias current source 603 is connected to the common node of the second current mirror 602 and the third current mirror 604. The bias current source 603 is employed to provide an offset to the current sense output. This offset can be used to compensate some errors (e.g., temperature coefficient induced errors and other offset errors from the operational amplifiers OA1 and OA2). Depending on different design needs and application, the bias current from the bias current source 603 can be adjusted accordingly.

Figure 7:
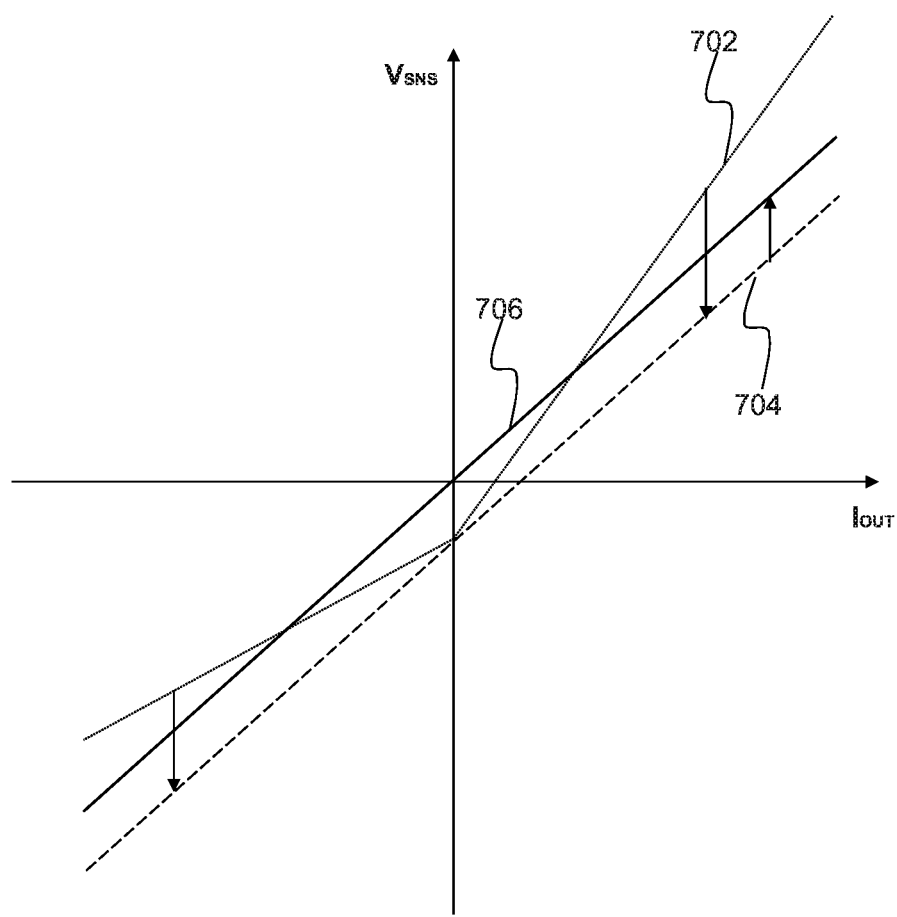
FIG. 7 illustrates the operating principle of the current sense apparatus shown in FIG. 6 in accordance with various embodiments of the present disclosure.

FIG. 7 illustrates the operating principle of the current sense apparatus shown in FIG. 6 in accordance with various embodiments of the present disclosure. The horizontal axis of FIG. 7 represents the current flowing through the power switch Q1. The unit of the horizontal axis is Ampere. The vertical axis represents the current sense voltage at the output of the current sense apparatus 400.

As shown in FIG. 7, a first line 702 represents an actual current sense voltage without enabling the adjustable current gain stages (e.g., the plurality of upper transistor-switch networks and the plurality of lower transistor-switch networks) and the bias current source shown in FIG. 6. A second line 704 represents a post-trim current sense voltage after the adjustable current gain stages have been enabled. A third line 706 represents an ideal current sense voltage after the bias current source has been enabled.

It should be noted that the lines shown in FIG. 7 are merely examples, which should not unduly limit the scope of the claims. One of ordinary skill in the art would recognize many variations, alternatives, and modifications. For example, the current sense gain may vary by adjusting the value of the resistor RS.

Figure 8:
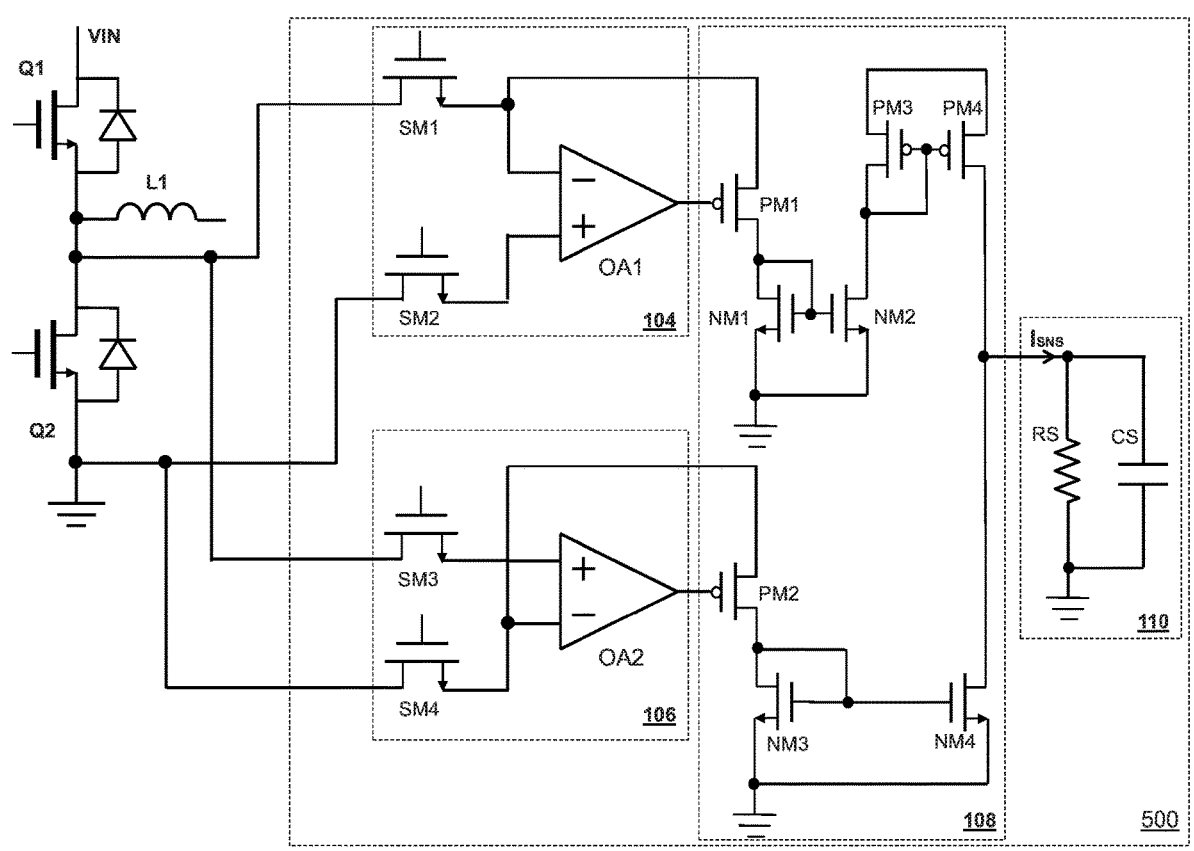
FIG. 8 illustrates a schematic diagram of a fourth implementation of the current sense apparatus shown in FIG. 1 in accordance with various embodiments of the present disclosure.

FIG. 8 illustrates a schematic diagram of a fourth implementation of the current sense apparatus shown in FIG. 1 in accordance with various embodiments of the present disclosure. The current sense apparatus 500 is similar to the current sense apparatus 200 shown in FIG. 2 except that the current sense apparatus 500 is connected to a low-side switch Q2 of the full-bridge of the wireless power transfer system. The operation principles of the current sense apparatus 500 are similar to those shown in FIGS. 3-4, and hence are not discussed in further detail to avoid repetition.

Figure 9:
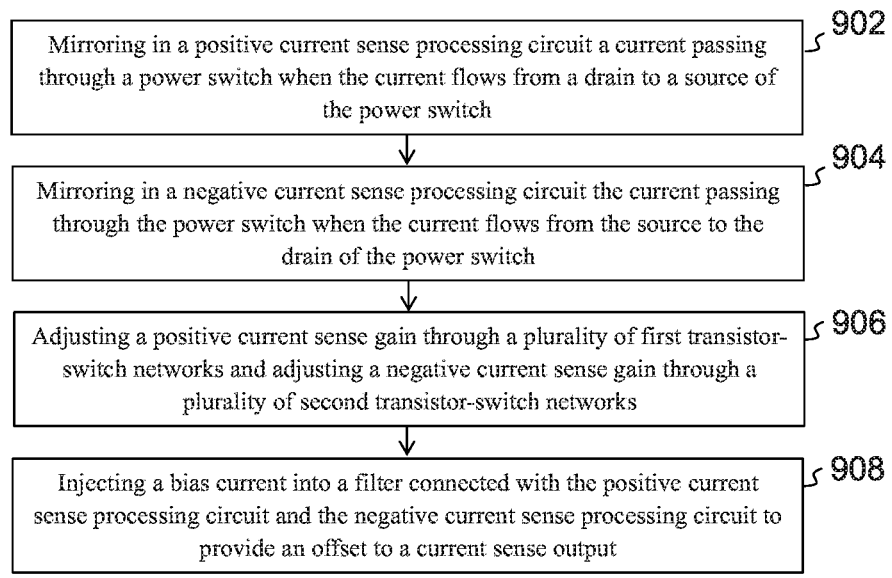
FIG. 9 illustrates a flow chart of a method for controlling the current sense apparatus shown in FIG. 1 in accordance with various embodiments of the present disclosure.

FIG. 9 illustrates a flow chart of a method for controlling the current sense apparatus shown in FIG. 1 in accordance with various embodiments of the present disclosure. This flowchart shown in FIG. 9 is merely an example, which should not unduly limit the scope of the claims. One of ordinary skill in the art would recognize many variations, alternatives, and modifications. For example, various steps illustrated in FIG. 9 may be added, removed, replaced, rearranged and repeated.

Referring back to FIG. 1, the current sense apparatus 100 comprises a positive current sense apparatus 104 having two inputs connected to a drain and a source of a power switch 102 respectively. In some embodiments, the positive current sense apparatus 104 comprises a first amplifier, a first sense switch and a second sense switch. The first sense switch is connected between the drain of the power switch and an inverting input of the first amplifier. The second sense switch is connected between the source of the power switch and a non-inverting input of the first amplifier.

The current sense apparatus 100 comprises a negative current sense apparatus 106 having two inputs connected to the drain and the source of the power switch 102 respectively. In some embodiments, the negative current sense apparatus 106 comprises a second amplifier, a third sense switch and a fourth sense switch. The third sense switch is connected between the drain of the power switch and a non-inverting input of the second amplifier. The fourth sense switch is connected between the source of the power switch and an inverting input of the second amplifier.

The current sense apparatus 100 further comprises a current sense processing apparatus 108 connected to the positive current sense apparatus 104 and the negative current sense apparatus 106 respectively. The current sense processing apparatus comprises a positive current sense processing circuit and a negative current sense processing circuit. The positive current sense processing circuit comprises a first current mirror and a first transistor connected in series. A gate of the first transistor is connected to an output of the first amplifier. A first drain/source terminal of the first transistor is connected to the inverting input of the first amplifier. A second drain/source terminal of the first transistor is connected to the first current mirror.

The negative current sense processing circuit comprises a second current mirror and a second transistor connected in series. A gate of the second transistor is connected to an output of the second amplifier. A first drain/source terminal of the second transistor is connected to the inverting input of the second amplifier. A second drain/source terminal of the second transistor is connected to the second current mirror. The current sense processing apparatus further comprises a third current mirror connected between the first current mirror and a filter.

In order to vary the current sense gain, the third current mirror may comprise a plurality of first transistor-switch networks connected in parallel for adjusting a current sense gain of the positive current sense processing circuit. The second current mirror comprises a plurality of second transistor-switch networks connected in parallel for adjusting a current sense gain of the negative current sense processing circuit.

At step 902, when a load current flows from a drain of the power switch 102 to a source of the power switch 102, a current passing through the power switch is mirrored in a positive current sense processing circuit. A ratio of the load current flowing through the power switch 102 to a sense current flowing through the current sense processing apparatus is equal to a ratio of a drain-to-source on-resistance of the first sense switch to a drain-to-source on-resistance of the power switch 102.

At step 904, when the load current flows from the source of the power switch 102 to the drain of the power switch 102, the current passing through the power switch is mirrored in a negative current sense processing circuit. A ratio of the load current flowing through the power switch 102 to a sense current flowing through the current sense processing apparatus is equal to a ratio of a drain-to-source on-resistance of the four sense switch to the drain-to-source on-resistance of the power switch 102.

At step 906, a positive current sense gain is adjusted by controlling the plurality of first transistor-switch networks connected in parallel with the third current mirror of the positive current sense processing circuit. A negative current sense gain is adjusted by controlling the plurality of second transistor-switch networks connected in parallel with the second current mirror of the negative current sense processing circuit.

At step 908, a bias current is injected into the filter connected with the positive current sense processing circuit and the negative current sense processing circuit to provide an offset to the current sense output of the current sense apparatus.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A device comprising:
a positive current sense amplifier having two inputs connected to a drain and a source of a power switch respectively through a plurality of positive current sense switches; and
a negative current sense amplifier having two inputs connected to the drain and the source of the power switch respectively through a plurality of negative current sense switches.

2. The device of claim 1, further comprising:
a current sense processing apparatus connected to the positive current sense amplifier and the negative current sense amplifier respectively.

3. The device of claim 2, wherein the current sense processing apparatus comprises a first current mirror, a second current mirror and a third current mirror, and wherein:
the first current mirror is configured to convert an output signal of the positive current sense amplifier into a first sink current;

the second current mirror is configured to convert an output signal of the negative current sense amplifier into a second sink current; and
the third current mirror is configured to convert the first sink current into a first source current.

4. The device of claim 3, wherein:
the first current mirror is connected to an output of the positive current sense amplifier through a first p-type transistor; and
the second current mirror is connected to an output of the negative current sense amplifier through a second p-type transistor.

5. The device of claim 3, wherein:
the first source current and the second sink current are fed into a filter connected to a common node of the second current mirror and the third current mirror.

6. The device of claim 3, wherein:
the second current mirror is a first variable gain current mirror comprising a plurality of first transistor-switch networks connected in parallel; and
the third current mirror is a second variable gain current mirror comprising a plurality of second transistor-switch networks connected in parallel.

7. The device of claim 3, wherein:
the current sense processing apparatus comprises a bias current source connected to a common node of the second current mirror and the third current mirror, and wherein the bias current source is configured to reduce temperature coefficient induced errors.

8. The device of claim 1, wherein:
the power switch is a high-side switch of a leg of a full-bridge in a wireless power transfer system.

9. The device of claim 1, wherein:
the power switch is a low-side switch of a leg of a full-bridge in a wireless power transfer system.

10. The device of claim 1, wherein:
a first positive current sense switch is connected between the drain of the power switch and an inverting input of the positive current sense amplifier;
a second positive current sense switch is connected between the source of the power switch and a non-inverting input of the positive current sense amplifier;
a first negative current sense switch is connected between the drain of the power switch and a non-inverting input of the negative current sense amplifier; and
a second negative current sense switch is connected between the source of the power switch and an inverting input of the negative current sense amplifier.

11. A system comprising:
a first power switch and a second power switch connected in series between a first voltage potential and a second voltage potential;
an inductor connected to a common node of the first power switch and the second power switch; and
a current sense apparatus connected to a drain terminal and a source terminal of one of the first power switch and the second power switch, wherein the current sense apparatus comprises:
a positive current sense device configured to sense a current flowing from the drain terminal to the source terminal; and
a negative current sense device configured to sense a current flowing from the source terminal to the drain terminal.

12. The system of claim 11, wherein:
the first voltage potential is connected to a power source;
the second voltage potential is connected to ground;

the positive current sense device comprises a first amplifier, a first sense switch and a second sense switch; and
the negative current sense device comprises a second amplifier, a third sense switch and a fourth sense switch.

13. The system of claim 12, wherein:
the first sense switch is connected between the drain terminal and an inverting input of the first amplifier;
the second sense switch is connected between the source terminal and a non-inverting input of the first amplifier;
the third sense switch is connected between the drain terminal and a non-inverting input of the second amplifier; and
the fourth sense switch is connected between the source terminal and an inverting input of the second amplifier.

14. The system of claim 12, further comprising:
a current sense processing apparatus connected to outputs of the positive current sense device and the negative current sense device; and
an output filter connected to an output of the current sense processing apparatus.

15. The system of claim 14, wherein the current sense processing apparatus comprises:
a positive current sense processing circuit comprising a first current mirror and a first transistor connected in series, and wherein a gate of the first transistor is connected to an output of the first amplifier, a first drain/source terminal of the first transistor is connected to an inverting input of the first amplifier and a second drain/source terminal of the first transistor is connected to the first current mirror; and
a negative current sense processing circuit comprising a second current mirror and a second transistor connected in series, and wherein a gate of the second transistor is connected to an output of the second amplifier, a first drain/source terminal of the second transistor is connected to an inverting input of the second amplifier and a second drain/source terminal of the second transistor is connected to the second current mirror.

16. The system of claim 15, further comprising:
a third current mirror connected to the first current mirror, wherein the third current mirror is configured to convert a first sink current generated by the first current mirror into a first source current, wherein the first source current and a second sink current generated by the second current mirror are fed into the output filter.

17. A system comprising:
a first power switch and a second power switch connected in series between a power source and ground;
an inductor connected to a common node of the first power switch and the second power switch; and
a current sense apparatus connected to a drain terminal and a source terminal of the first power switch, wherein the current sense apparatus comprises a positive current sense device configured to sense a current flowing from the drain terminal to the source terminal, and a negative current sense device configured to sense a current flowing from the source terminal to the drain terminal.

18. The system of claim 17, wherein:
the positive current sense device comprises a first sense switch, a second sense switch and a first amplifier, and wherein the first sense switch is connected between the drain terminal of the first power switch and an inverting input of the first amplifier, and the second sense switch is connected between the source terminal of the first power switch and a non-inverting input of the first amplifier; and
the negative current sense device comprises a third sense switch, a fourth sense switch and a second amplifier, and wherein the third sense switch is connected between the drain terminal of the first power switch and a non-inverting input of the second amplifier, and the fourth sense switch is connected between the source terminal of the first power switch and an inverting input of the second amplifier.

19. The system of claim 18, further comprising:
a current sense processing apparatus connected to outputs of the positive current sense device and the negative current sense device; and
an output filter connected to an output of the current sense processing apparatus, wherein the current sense processing apparatus comprises a first current mirror, a second current mirror and a third current mirror, and wherein:
the first current mirror is configured to convert an output signal of the positive current sense device into a first sink current;
the second current mirror is configured to convert an output signal of the negative current sense device into a second sink current; and
the third current mirror is configured to convert the first sink current into a first source current.

20. The system of claim 19, wherein:
the output filter comprises an adjustable capacitor and an adjustable resistor connected in parallel.

* * * * *